(12) United States Patent
Yamasaki

(10) Patent No.: US 10,937,675 B2
(45) Date of Patent: Mar. 2, 2021

(54) SUBSTRATE PROCESSING APPARATUS, SUBSTRATE PROCESSING APPARATUS CONTROL METHOD, AND STORAGE MEDIUM STORING PROGRAM

(71) Applicant: Ebara Corporation, Tokyo (JP)

(72) Inventor: Gaku Yamasaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 91 days.

(21) Appl. No.: 16/217,188

(22) Filed: Dec. 12, 2018

(65) Prior Publication Data

US 2019/0189480 A1 Jun. 20, 2019

(30) Foreign Application Priority Data

Dec. 18, 2017 (JP) .............................. JP2017-241911

(51) Int. Cl.
*H01L 21/67* (2006.01)
*C25D 21/12* (2006.01)
(Continued)

(52) U.S. Cl.
CPC ...... *H01L 21/67259* (2013.01); *C25D 17/001* (2013.01); *C25D 17/06* (2013.01); *C25D 21/12* (2013.01); *G05B 19/4189* (2013.01); *H01L 21/67766* (2013.01); *H01L 21/67778* (2013.01); *H01L 21/681* (2013.01); *G05B 2219/45031* (2013.01)

(58) Field of Classification Search
CPC ............ H01L 21/67259; H01L 21/681; H01L 21/67766; H01L 21/67778; C25D 17/06; C25D 17/001; C25D 21/12; G05B 19/4189; G05B 2219/45031
See application file for complete search history.

(56) References Cited

U.S. PATENT DOCUMENTS 5,290,027 A * 3/1994 Clanton ................. B65H 9/103
112/470.03
5,537,311 A * 7/1996 Stevens ................. G03F 7/7075
700/254
(Continued)

FOREIGN PATENT DOCUMENTS

JP 62161657 A * 7/1987
JP 5750327 B 5/2015

*Primary Examiner* — Thomas C Lee
*Assistant Examiner* — Michael Tang
(74) *Attorney, Agent, or Firm* — Abelman, Frayne & Schwab

(57) ABSTRACT

A substrate processing apparatus includes: a stage configured to place thereon a substrate or at least a portion of a substrate holding member configured to hold the substrate, the substrate having two sides extending in a first direction and two sides extending in a second direction; a transporter configured to transport the substrate to a position facing the stage; first and second sensors, which are fixed relative to the stage and respectively located outside the sides, extending in the second direction, of the substrate at the position facing the stage so as to detect the sides of the substrate, respectively; and third and fourth sensors, which are fixed relative to the stage and respectively located outside the sides, extending in the first direction, of the substrate at the position facing the stage so as to detect the sides of the substrate, respectively.

17 Claims, 11 Drawing Sheets

(51) Int. Cl.
*C25D 17/00* (2006.01)
*G05B 19/418* (2006.01)
*H01L 21/677* (2006.01)
*C25D 17/06* (2006.01)
*H01L 21/68* (2006.01)

(56) References Cited

U.S. PATENT DOCUMENTS 5,740,059 A * 4/1998 Hirata ............... H01L 21/67259
700/213
7,572,092 B2 * 8/2009 Hofmeister ............. B25J 19/02
294/907

* cited by examiner

SUBSTRATE PROCESSING APPARATUS, SUBSTRATE PROCESSING APPARATUS CONTROL METHOD, AND STORAGE MEDIUM STORING PROGRAM

CROSS-REFERENCE TO RELATED APPLICATIONS

This application is based on and claims priority from Japanese Patent Application No. 2017-241911, filed on Dec. 18, 2017, with the Japan Patent Office, the disclosure of which is incorporated herein in their entireties by reference.

TECHNICAL FIELD

The present disclosure relates to a substrate processing apparatus, a method of controlling the substrate processing apparatus, and a storage medium storing a program for causing a computer to execute the method of controlling the substrate processing apparatus.

BACKGROUND

A plating apparatus performs a plating processing on a substrate attached to a substrate holder. In such a plating apparatus, a substrate may be displaced from a predetermined correct position when the substrate is attached to and/or detached from the substrate holder. In addition, a positional deviation of the substrate may occur because of various reasons such as the warping of the substrate holder, the table on which the substrate holder is placed, or the warping of the substrate itself. Alternatively, a positional deviation of the substrate may also occur due to, for example, water drops on the substrate surface or inclination of the substrate holder due to dust on the table. When there is such positional deviation, there is a possibility that the plating processing on the substrate as an object to be plated may not be performed correctly.

There has been proposed a technique for detecting the position of a substrate when the substrate is mounted on a substrate holder and correcting the position of the substrate when the position of the substrate is deviated (e.g., Japanese Patent No. 5750327). In the technique described in Japanese Patent No. 5750327, a notch portion 17 is provided at a position corresponding to the edge portion of the substrate 500 in a fixedly holding member 15 of the substrate holder 110, and a laser sensor 1140 is disposed so as to be capable of irradiating the surface of the notch 17 without being blocked when the substrate 500 is placed at a correct position. When the substrate 500 is placed on the fixedly holding member 15, the laser sensor 1140 measures the distance, and when the measured distance is a distance A to the notch portion 17, it is determined that there is no positional deviation in the substrate 500. In the meantime, when the measured distance is a distance to the substrate 500 [W1 (<A)], it is determined that a positional deviation is caused in the substrate 500. In this technique, since the notch portion 17 for position measurement is provided in the substrate holder, it is necessary to change the configuration of many substrate holders to be used. In addition, when the substrate holder itself is thin, it may be difficult to form the notch portion so as to ensure sufficient detection accuracy.

Alternatively, in general, it is possible that in the future, various semiconductor manufacturing apparatuses may be required to process, with relatively high accuracy, various substrates which have not been seen so far such as, for example, a substrate on which a finer pattern is formed compared to conventional substrates, and a substrate in which various materials are used as a semiconductor material. In addition, in such semiconductor manufacturing apparatuses, it is assumed that, for example, transfer of a substrate onto a processing table and positioning of a substrate are required to be performed with higher accuracy than before. It is also required to shorten a processing time required for positioning a substrate.

SUMMARY

According to an aspect of the present disclosure, provided is a substrate processing apparatus including: a stage configured to place thereon a substrate or at least a portion of a substrate holding member configured to hold the substrate, the substrate having two sides extending in a first direction and two sides extending in a second direction; a transporter configured to transport the substrate to a position facing the stage; first and second sensors, which are fixed relative to the stage and respectively located outside the sides, extending in the second direction, of the substrate at the position facing the stage so as to detect the sides of the substrate, respectively; and third and fourth sensors, which are fixed relative to the stage and respectively located outside the sides, extending in the first direction, of the substrate at the position facing the stage so as to detect the sides of the substrate, respectively.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
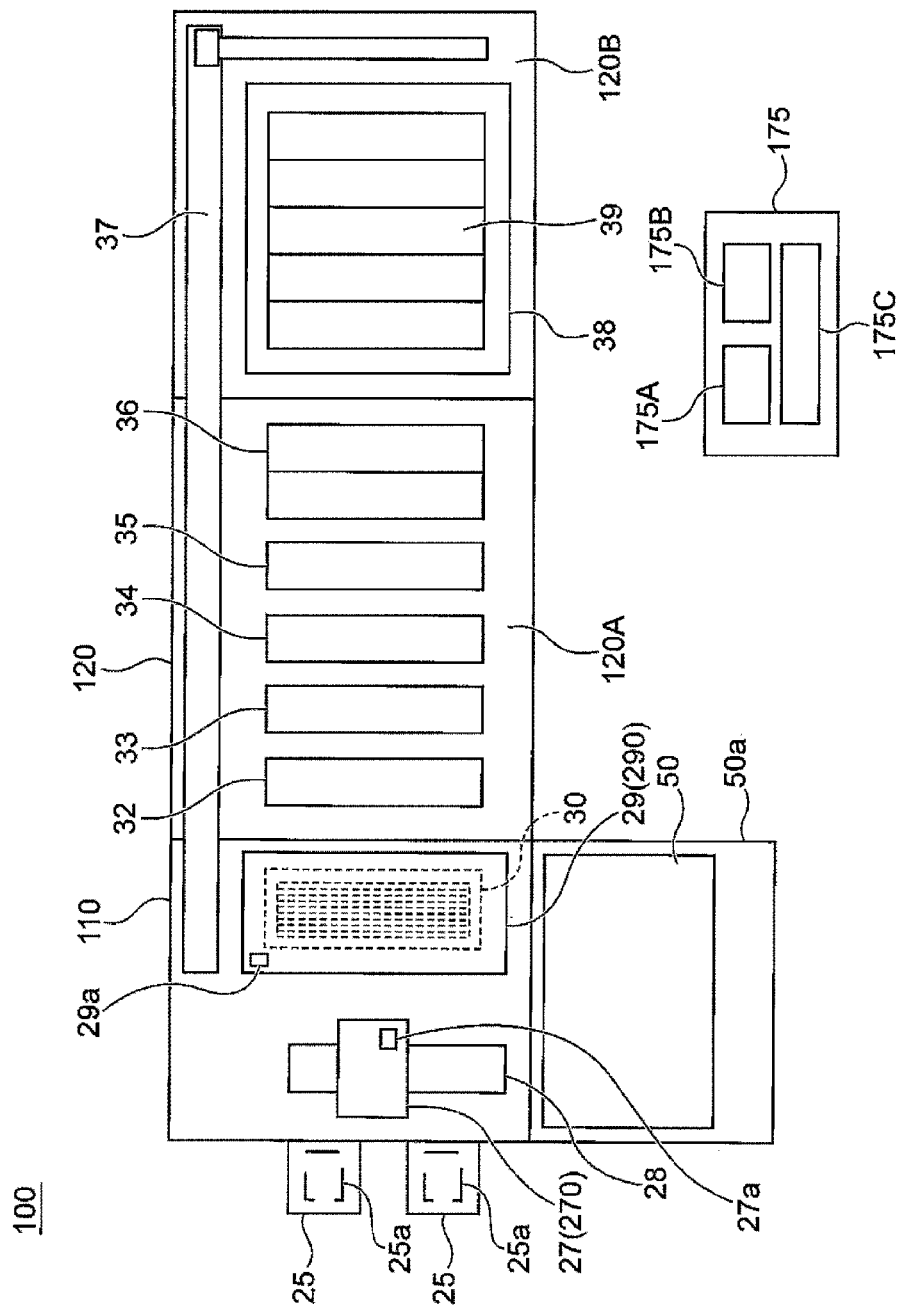
FIG. 1 is an overall layout view of a substrate processing apparatus according to an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

An object of the present disclosure is to solve at least some of the problems described above.

According to an aspect of the present disclosure, provided is a substrate processing apparatus including: a stage configured to place thereon a substrate or at least a portion of a substrate holding member configured to hold the substrate, the substrate having two sides extending in a first direction and two sides extending in a second direction; a transporter configured to transport the substrate to a position facing the stage; first and second sensors, which are fixed relative to the stage and respectively located outside the sides, extending in the second direction, of the substrate at the position facing the stage so as to detect the sides of the substrate, respectively; and third and fourth sensors, which are fixed relative to the stage and respectively located outside the sides, extending in the first direction, of the substrate at the position facing the stage so as to detect the sides of the substrate, respectively.

According to an aspect of the present disclosure, provided is a substrate processing apparatus including: a stage configured to place thereon a substrate or at least a portion of a substrate holding member configured to hold the substrate, the substrate having two sides extending in a first direction and two sides extending in a second direction; a transporter configured to transport the substrate to a position facing the stage; first and second sensors, which are fixed relative to the stage and located outside one side, extending in the second direction, of the substrate at the position facing the stage so as to detect the one side of the substrate; a third sensor, which is fixed relative to the stage and located outside a remaining side, extending in the second direction, of the substrate at the position facing the stage so as to detect the remaining side of the substrate; and fourth and fifth sensors, which are fixed relative to the stage and respectively located outside the sides, extending in the first direction, of the substrate at the position facing the stage so as to detect the sides of the substrate, respectively.

Hereinafter, embodiments of the present disclosure will be described with reference to the accompanying drawings. In each of the following embodiments, the same or corresponding members are denoted by the same reference numerals, and duplicate explanations are omitted. In addition, in the present specification, expressions such as, for example, "upper," "lower," "left," and "right" are used, but these are indicative of the positions and directions on the papers in the example drawings for the convenience of explanation and may differ from those in actual arrangement, for example, during the use of an apparatus. Also, when it is described that a certain member is positioned on a side opposite to another member with respect a substrate, it means that a member located to face a substrate surface of the substrate and a member located to face a substrate surface on the opposite side are positioned. In addition, wiring is formed on one of the surfaces of a substrate, or wiring may be formed on both surfaces in some cases.

First Embodiment

FIG. 1 is an overall layout view of a substrate processing apparatus 100 according to an embodiment of the present disclosure. In this example, the substrate processing apparatus 100 is an electrolytic plating apparatus. Here, the electrolytic plating apparatus will be described as an example, but the present disclosure is also applicable to other substrate processing apparatuses such as, for example, an arbitrary plating apparatus, a polishing apparatus, a grinding apparatus, a film forming apparatus, and an etching apparatus.

The substrate processing apparatus 100 is roughly divided into a loading/unloading section 110 configured to load a substrate (a workpiece) onto a substrate holder 11 (see, e.g., FIGS. 2A and 2B) or unload the substrate from the substrate holder 11, a processing section 120 configured to process a substrate S, and a cleaning section 50a. The processing section 120 further includes a pre-processing/post-processing section 120A configured to performing pre-processing and post-processing of the substrate and a plating processing section 120B configured to perform a plating processing on a substrate. Incidentally, the substrate includes an angular substrate and a circular substrate. Further, the angular substrate includes a polygonal workpiece such as, for example, a polygonal (e.g., rectangular) glass substrate, liquid crystal substrate, or printed circuit board. The circular substrate includes a circular workpiece such as, for example, a semiconductor wafer or a glass substrate.

The loading/unloading section 110 includes a plurality of cassette tables 25 and a substrate attaching/detaching device 29. The cassette table 25 is equipped with a cassette 25a containing substrates S. The substrate attaching/detaching device 29 is disposed in the substrate attaching/detaching section 290 and is configured to attach/detach the substrate S to/from the substrate holder 11. The substrate attaching/detaching device 29 includes a control device 29a. The control device 29a communicates with the controller 175 of the substrate processing apparatus 100, and controls the operation of the substrate attaching/detaching device 29. A stocker 30 configured to accommodate the substrate holder 11 is provided in the vicinity of (e.g., below) the substrate attaching/detaching device 29. At the center of these units 25, 29, and 30, a substrate transport device 270 having a transport robot 27 configured to transport a substrate between these units is disposed. The substrate transport device 270 is configured to be capable of traveling using a travel mechanism 28. The substrate transport device 270 includes a controller 27a. The controller 27a communicates with the controller 175 of the substrate processing apparatus 100, and controls the operation of the substrate transport device 270.

The cleaning section 50a includes a cleaning apparatus 50 configured to clean and dry a substrate after the plating processing. The substrate transport device 270 is configured to transport a plated substrate to the cleaning apparatus 50 and take out the cleaned substrate from the cleaning apparatus 50.

The pre-processing/post-processing section 120A has a pre-wet tank 32, a pre-soak tank 33, a pre-rinse tank 34, a blow tank 35, and a rinse tank 36. In the pre-wet tank 32, a substrate is immersed in pure water. In the pre-soak tank 33, an oxide film on the surface of a conductive layer such as, for example, a seed layer formed on a surface of a substrate is etched away. In the pre-rinse tank 34, the substrate after the pre-soak is cleaned with the cleaning liquid (e.g., pure water) together with the substrate holder. In the blow tank 35, liquid draining of the substrate after cleaning is performed. In the rinse tank 36, the substrate after plating is cleaned with the cleaning liquid together with the substrate holder. The configuration of the pre-processing/post-processing section 120A of the substrate processing apparatus 100 is an example, and the configuration of the pre-processing/post-processing section 120A of the substrate processing apparatus 100 is not limited thereto, and other configurations may be adopted.

The plating processing section 120B includes a plurality of plating tanks 39 provided with an overflow tank 38. Each plating tank 39 accommodates one substrate therein, and the substrate is immersed in the plating solution held therein so as to perform plating such as, for example, copper plating on the substrate surface. Here, the type of the plating solution is not particularly limited, and various plating solutions are used depending on the application thereof.

The substrate processing apparatus 100 includes a substrate holder transport device 37 that employs, for example, a linear motor system, which is located at a lateral side of each of these apparatuses so as to transport the substrate holder together with the substrate between these apparatuses. The substrate holder transport device 37 is configured to transport the substrate holder between the substrate attaching/detaching device 29, the pre-wet tank 32, the pre-soak tank 33, the pre-rinse tank 34, the blow tank 35, the rinse tank 36, and the plating tank 39.

The plating processing system including the substrate processing apparatus 100 configured as described above include a controller 175 configured to control each of the above-described sections. The controller 175 includes a memory 175B storing various setting data and various programs, a CPU 175A executing the programs of the memory 175B, and a control unit 175C implements when the CPU 175A executes the programs. A storage medium constituting the memory 175B may include a volatile storage medium and/or a nonvolatile storage medium. The storage medium may include one or more of arbitrary storage media such as, for example, ROM, RAM, hard disk, CD-ROM, DVD-ROM, and flexible disk. The programs stored in the memory 175A includes, for example, a program for controlling transport of the substrate transport device 270, a program for controlling a substrate position detection device 600 (described later), and the substrate attaching/detaching device 29 configured to attach/detach a substrate to/from the substrate holder, a program for controlling transport of the substrate holder transport device 37, and a program for controlling the plating processing in each plating tank 39. In addition, the controller 175 is configured to be capable of communicating with a host controller (not illustrates) that generally controls the substrate processing apparatus 100 and other related apparatuses, and is capable of exchanging data with a database of a host controller.

Figure 2A:
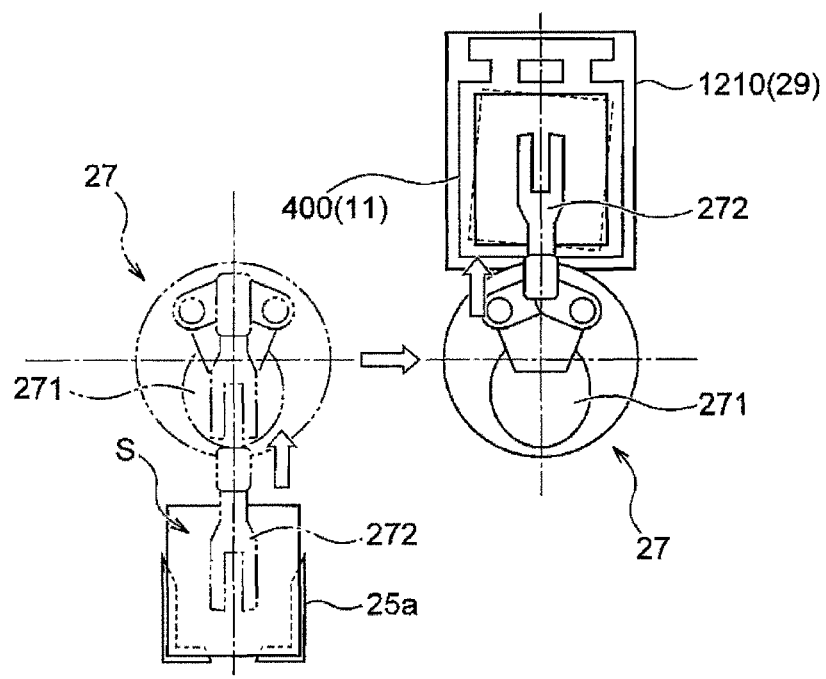
FIG. 2A is a plan view of a relevant portion for explaining transport of a substrate to a substrate holder.
Figure 2B:
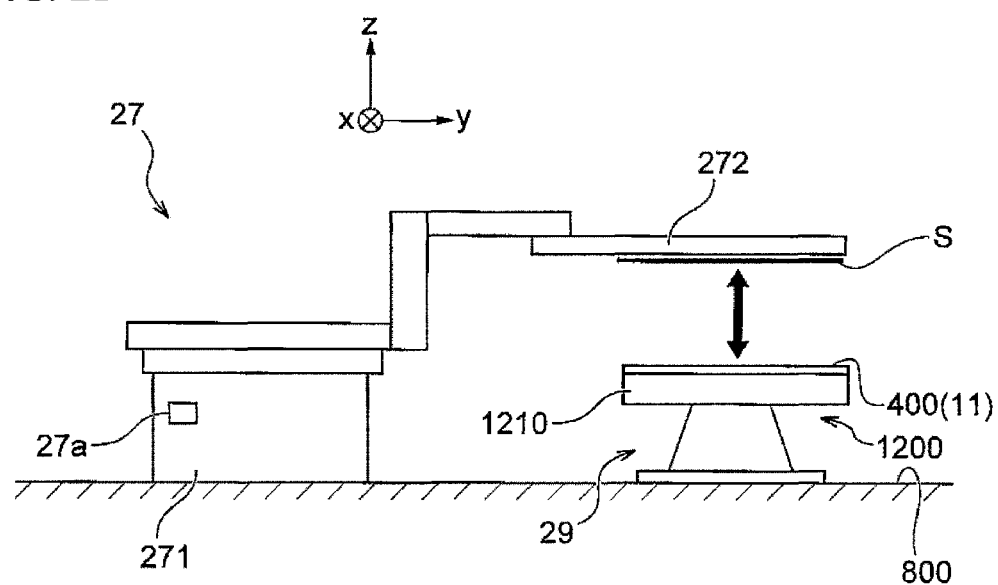
FIG. 2B is a side view of the relevant portion for explaining transport of a substrate to a substrate holder.

FIG. 2A is a plan view of a relevant portion for explaining transport of a substrate to a substrate holder. FIG. 2B is a side view of the relevant portion for explaining transport of a substrate to a substrate holder. The transport robot 27 takes out a substrate S from the cassette 25a and places the substrate S on a second holding member 400 of the substrate holder 11 placed on a stage 1210 of the substrate attaching/detaching section 290. As illustrated in FIG. 2B, the stage 1210 is provided on a rotation device 1200. The rotation device 1200 is a portion of the substrate attaching/detaching device 29. After the substrate S is placed on the second holding member 400 of the substrate holder 11, the rotation device 1200 rotates the stage 1210 (the second holding member 400) in the vertical posture, and then the rotation device moves to a station (not illustrated) that maintains a first holding member of the substrate holder 11 in a vertical posture. The rotation device 1200 presses the second holding member 400 toward the first holding member, and the second holding member 400 is fixed to the first holding member by a clamp provided on the first holding member. As a result, the substrate S is held on the substrate holder 11. The configuration of the substrate holder is merely an example, and may be configured such that the substrate is placed on the second holding member in the horizontal posture, then the first holding member is moved with respect to the second holding member in the horizontal posture, and then the substrate holder holds the substrate. In addition, the substrate holder may be configured such that the substrate is mounted on the second holding member in the horizontal posture from a lower side. Further, the substrate holder may be configured such that the substrate is mounted on the second holding member in the vertical posture. The present embodiment is applicable to any configuration.

Figure 3:
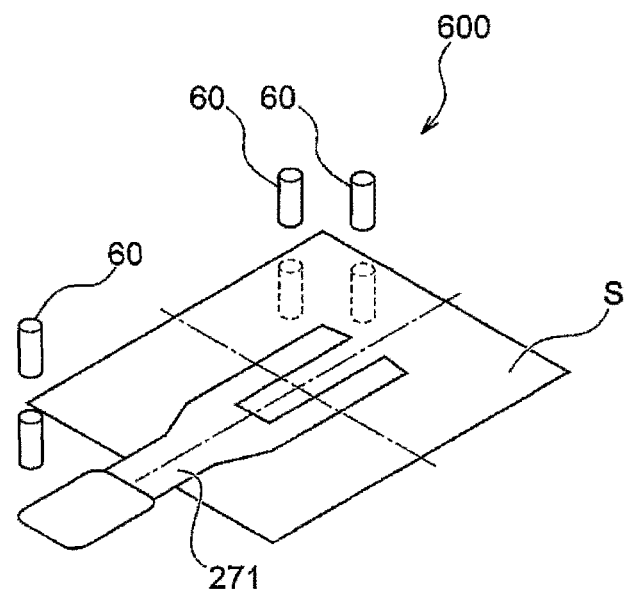
FIG. 3 is a perspective view of a substrate position detection device.

FIG. 3 is a perspective view of a substrate position detection device. A substrate position detection device 600 having a plurality of sensors 60 is disposed so as to perform positioning (alignment) of the substrate S in the horizontal direction when the substrate is moved by the transport robot 27 to a position facing the stage 1210 (hereinafter, referred to as a "predetermined position"). The predetermined position may be right above a target position on the substrate holder. The plurality of sensors 60 are arranged adjacent to the outside of one or more edges (sides) of the substrate S when the substrate S is moved to the predetermined position. When the substrate S is moved to the predetermined position, the plurality of sensors 60 are adjacent to any one of the edges of the substrate S, but are disposed at positions where no edge is detected. The sensors 60 are optical sensors such as, for example, photoelectric sensors and laser sensors. Each sensor 60 is positioned and fixed relative to the stage 1210. In the case where the sensor 60 is of a transmissive type, when the substrate is moved to the predetermined position, a light-emitting element and a light-receiving element of the sensor are arranged on opposite sides with respect to the substrate S. In the case where the sensor 60 is a reflective type, the sensor 60 may be disposed on either side (upper side or lower side) of the substrate when the substrate is moved to the predetermined position. In addition, as the sensor 60, a contact sensor may be used in place of the optical sensor.

Figure 4:
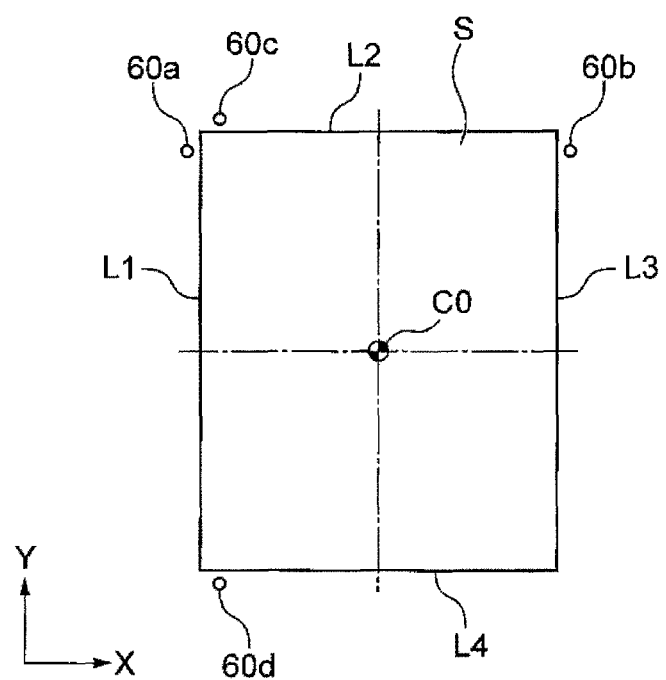
FIG. 4 is a plan view of a substrate position detection device according to a first embodiment.

FIG. 4 is a plan view of a substrate position detection device according to a first embodiment. In the drawing, the substrate S is illustrated in the case where the substrate is in a normal position when it is transported to the predetermined position. The normal position is the position when the substrate S is properly placed right above the target position on the substrate holder. That is, in the horizontal rear, there is no error from the target position, and only the position in the vertical direction is different. In addition, for the sake of convenience, respective directions in the horizontal direction will be described as an X direction and a Y direction (see, e.g., FIG. 4).

As illustrated in FIG. 4, the substrate S has a rectangular shape, and has sides L1 and L3 (Y edges) extending in the Y-axis direction and sides L2 and L4 (X edges) extending in the X-axis direction. The substrate position detection device 600 has a plurality of sensors 60. The plurality of sensors 60 includes a sensor 60a adjacent to the side L1 outside the side L1, a sensor 60b adjacent to the side L3 outside the side L3, a sensor 60c adjacent to the side L2 outside the side L2, and a sensor 60d adjacent to the side L4 outside the side L4. The sensor 60a is a sensor for detecting the side L1 which is a Y edge adjacent thereto. The sensor 60b is a sensor for detecting the side L3 which is a Y edge adjacent thereto. The sensor 60c is a sensor for detecting the side L2 which is an X edge adjacent thereto. The sensor 60d is a sensor for detecting the side L4 which is an X edge adjacent thereto. In this example, the sensor 60a and the sensor 60b are disposed at positions facing each other, but these sensors do not necessarily need to be arranged at positions facing each other. The sensor 60a may be disposed at any position adjacent to the side L1 outside the side L1 and the sensor 60b may be disposed at any position adjacent the side L3 outside the side L3. Likewise, the sensor 60c may be disposed at any position adjacent to the side L2 outside the side L2, and the sensor 60d may be disposed adjacent to the side L4 outside the side L4. When the substrate S is transported to the predetermined position, each sensor is disposed outside each side such that any side of the substrate S is not detected.

Figure 5:
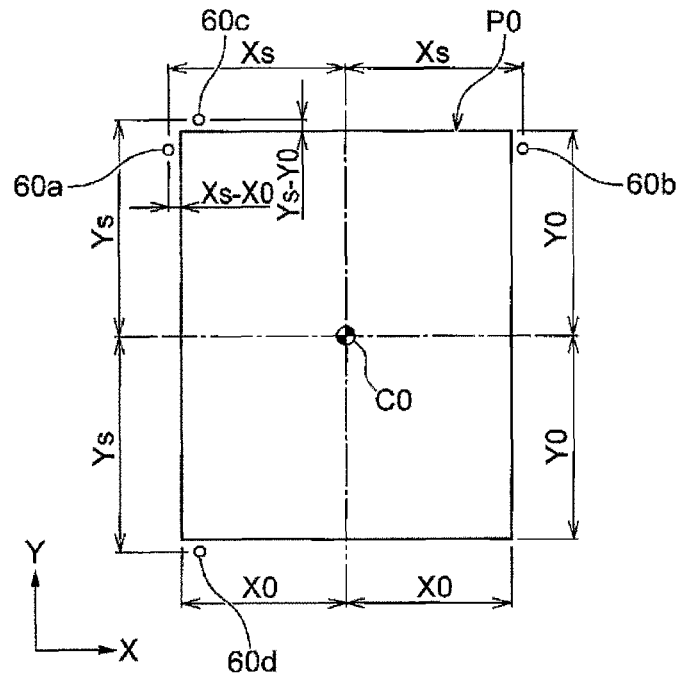
FIG. 5 is an explanatory view for explaining a correction processing of a center position of a substrate.

FIGS. 5 to 9 are explanatory views for explaining a correction processing of a center position of a substrate. Prior to a substrate position detection processing, a target position P0 of a substrate, that is, the target position P0 on the substrate holder 11 is set. In this example, the target position P0 is set as a target center position C0 of the substrate. At a position facing the stage 1210, when the position (center position) of the substrate S in the direction parallel to the surface of the stage 1210 (in the present embodiment, horizontal direction) coincides with the target position P0 (target center position C0), the position of the substrate S is assumed to be P0. In addition, the distance from the center position C0 of the substrate S to the Y edges (sides L1 and L3) in the dimension on design (regular dimension) of the substrate S is assumed to be X0, and the distance from the center position C0 to the X edges (sides L2 and L4) is assumed to be Y0. In other words, ½ of the X-direction dimension of the substrate S is assumed to be X0 and ½ of the Y-direction dimension of the substrate S is assumed to be Y0. In addition, as illustrated in FIG. 5, the distance from the center position C0 at the regular position of the substrate S to the sensor 60a and the sensor 60b is assumed to be Xs. The distance from the center position C0 at the regular position of the substrate S to the sensor 60c and the sensor 60d is assumed to be Ys. Therefore, when the substrate is located at the regular position, the distance between the Y edges of the substrate (the sides L1 and L3) and the sensors 60a and 60b is Xs−X0, and the distance between the X edges of the substrate (the sides L2 and L4) and the sensors 60c and 60d is Ys−Y0.

Figure 6A:
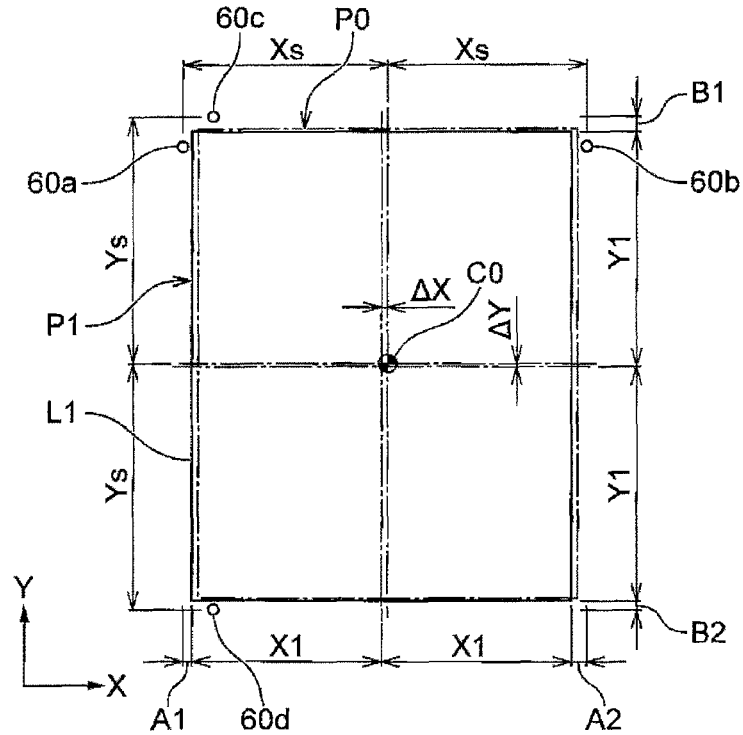
FIG. 6A is an explanatory view for explaining a correction processing of a center position of a substrate.
Figure 6B:
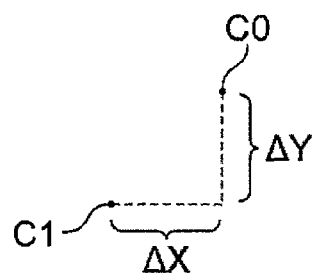
FIG. 6B is an explanatory view for explaining a correction processing of a center position of a substrate.

FIG. 6A illustrates a case where the position of the substrate transported to the position facing the stage is at a position P1 which is deviated from P0. FIG. 6B is an enlarged view illustrating a positional relationship between the center position C1 of the transported substrate and the target center position C0. At this time, at the position P1, the center position C1 of the substrate S is deviated from the target center position C0 by ΔX in the −X direction and by ΔY in the −Y direction. In addition, the dimensions of the substrate have errors from the regular dimensions and that halves of dimensions of the transported substrate are assumed to be X1 and Y1 respectively. In addition, it is determined in advance how much the position of the substrate is actually displaced through, for example, tests, and respective sensors are arranged such that even when ΔX and ΔY become maximum, each sensor does not detect an edge of the substrate at the time when the substrate is transported to the predetermined position.

Figure 7:
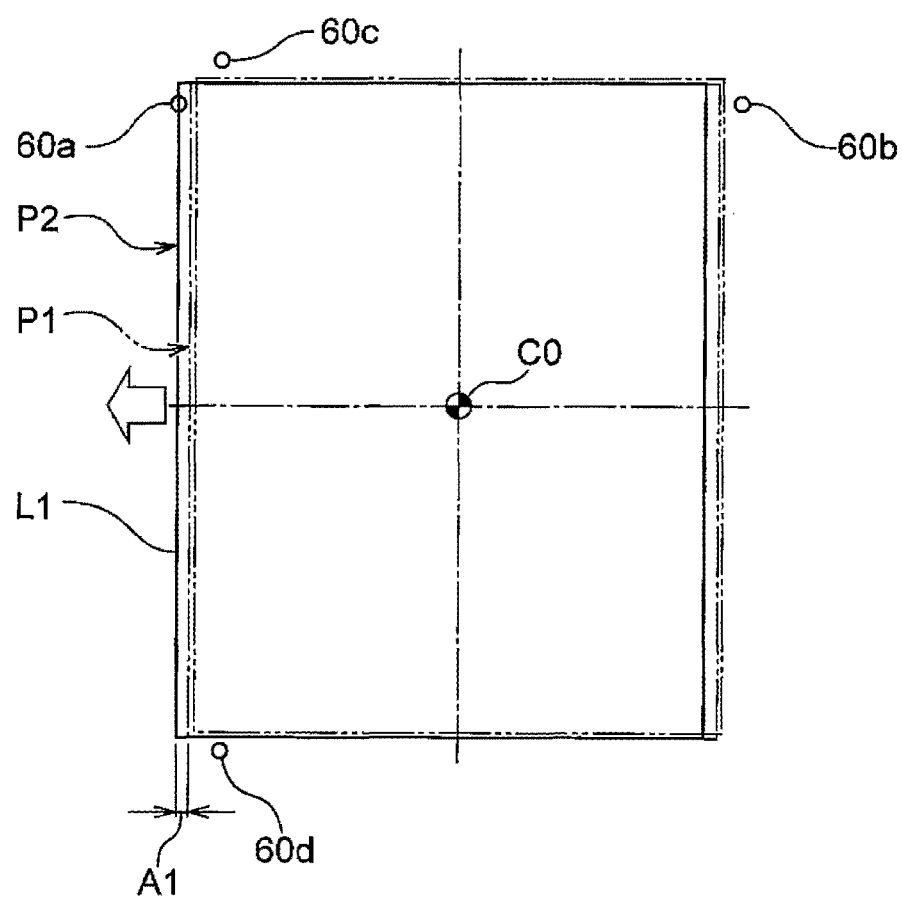
FIG. 7 is an explanatory view for explaining a correction processing of a center position of a substrate.
Figure 8:
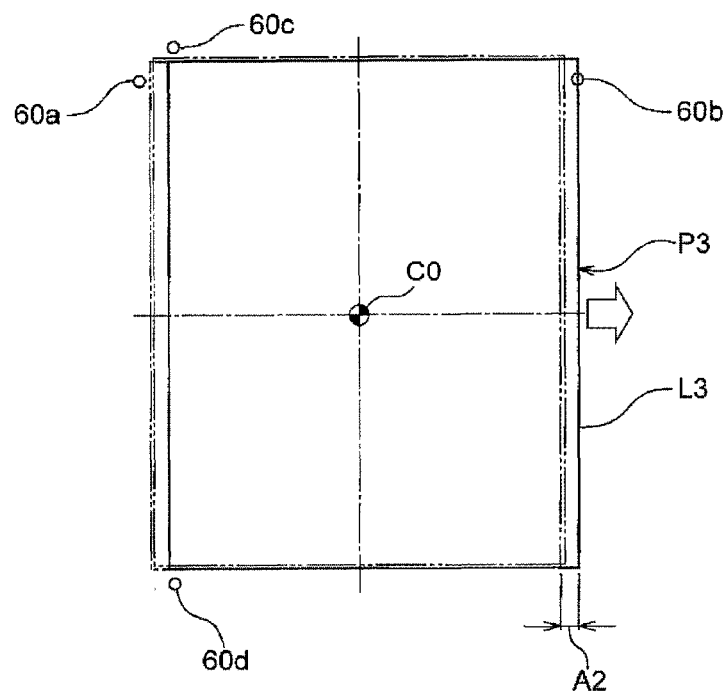
FIG. 8 is an explanatory view for explaining a correction processing of a center position of a substrate.

After the substrate is transported to the position of FIG. 6A, the substrate S is moved in the −X direction with respect to the stage 1210 (the sensors 60a to 60d) as illustrated in FIG. 7. At this time, even if the substrate S is moved by the transport robot 27, the stage 1210 (the sensors 60a to 60d) may be moved. In other words, the relative position of the substrate S with respect to the stage 1210 (the sensors 60a to 60d) may be moved (displaced) such that an edge of the substrate S approaches a sensor adjacent thereto. In the case of FIG. 7, the relative position of the substrate S with respect to the stage 1210 (sensor 60a) is moved such that the side L1 of the substrate S approaches the sensor 60a. The position of the substrate S when the substrate S is moved in the −X direction until the sensor 60a detects the side L1 as a Y edge of the substrate S is assumed to be P2. The amount of movement in the −X direction when the position of the substrate S is moved from P1 to P2 is assumed to be A1. In addition, the position of the substrate S when the substrate S is moved in the +X direction until the sensor 60b detects the side L3 as a Y edge of the substrate S as illustrated in FIG. 8, is assumed to be P3. The amount of movement in the +X direction when the position of the substrate S is moved from P1 to P3 is assumed to be A2.

At this time, as illustrated in FIG. 6A, the distance obtained by subtracting ΔX from the distance Xs from the target center position C0 of the substrate S to the sensor 60a is equal to the sum of a half of the dimension of the transported substrate S, X1, and the movement amount A1. In addition, the distance obtained by adding ΔX to the distance from the target center position C0 to the sensor 60a, Xs, is equal to the sum of a half of the dimension of the transported substrate S, X1, and the movement amount A2. When these are represented by equations, the following Equations (1) and (2) are obtained.

$$Xs - \Delta X = X1 + A1 \tag{1}$$

$$Xs + \Delta X = X1 + A2 \tag{2}$$

From Equations (1) and (2), ΔX can be calculated as follows.

$$\Delta X = (A2 - A1)/2 \tag{3}$$

As a result, when the substrate is moved in the +X direction by the movement amount ΔX calculated by Equation (3), the X coordinates of the center position C1 of the transported substrate S and the target center position C0 coincide with each other. In addition, when ΔX is a negative value, the substrate is moved in the −direction by the distance of the absolute value of ΔX.

Figure 9:
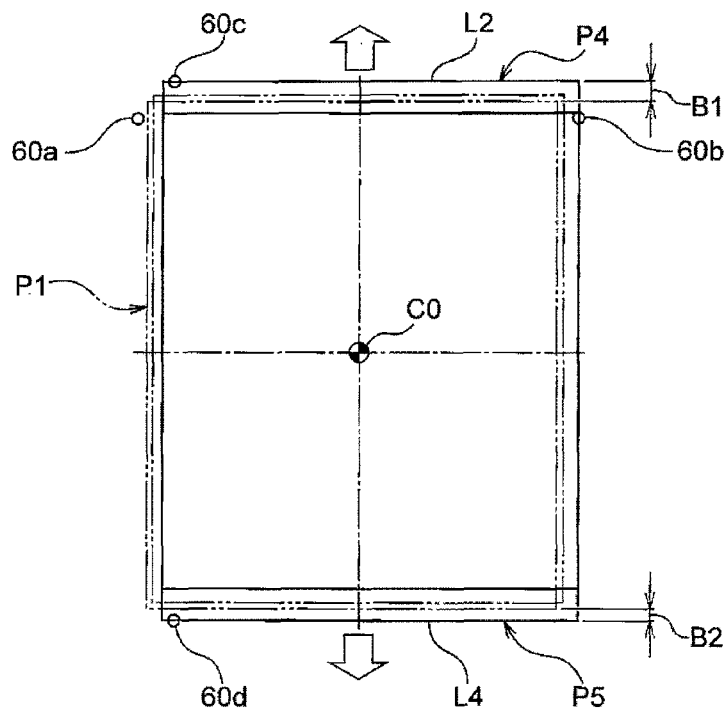
FIG. 9 is an explanatory view for explaining a correction processing of a center position of a substrate.

ΔY may be similarly calculated. As illustrated in FIG. 9, the movement amount B1 is calculated by moving the substrate S in the +Y direction until the sensor 60c detects the side L2 as a X edge of the substrate S. Further, the movement amount B2 is calculated by moving the substrate S in the −Y direction until the sensor 60d detects the side L4 as an X edge of the substrate S. As in the case of the X direction, ΔY is calculated as follows.

$$Ys + \Delta Y = Y1 + B1 \tag{4}$$

$$Ys - \Delta Y = Y1 + B2 \tag{5}$$

$$\Delta Y = (B1 - B2)/2 \quad (6)$$

As a result, when the substrate is moved in the +Y direction by the movement amount ΔY calculated by Equation (6), the Y coordinates of the center position C1 of the transported substrate S and the target center position C0 coincide with each other. When ΔY is a negative value, the substrate is moved in the −Y direction by the distance of the absolute value of ΔY.

As described above, by aligning the X, Y coordinates of the center position C1 of the transported substrate S with the target center position C0, the positioning of the substrate S is completed. After positioning, the substrate S is placed on the second holding member 400 of the substrate holder 11 by the transport robot 27.

Figure 10:
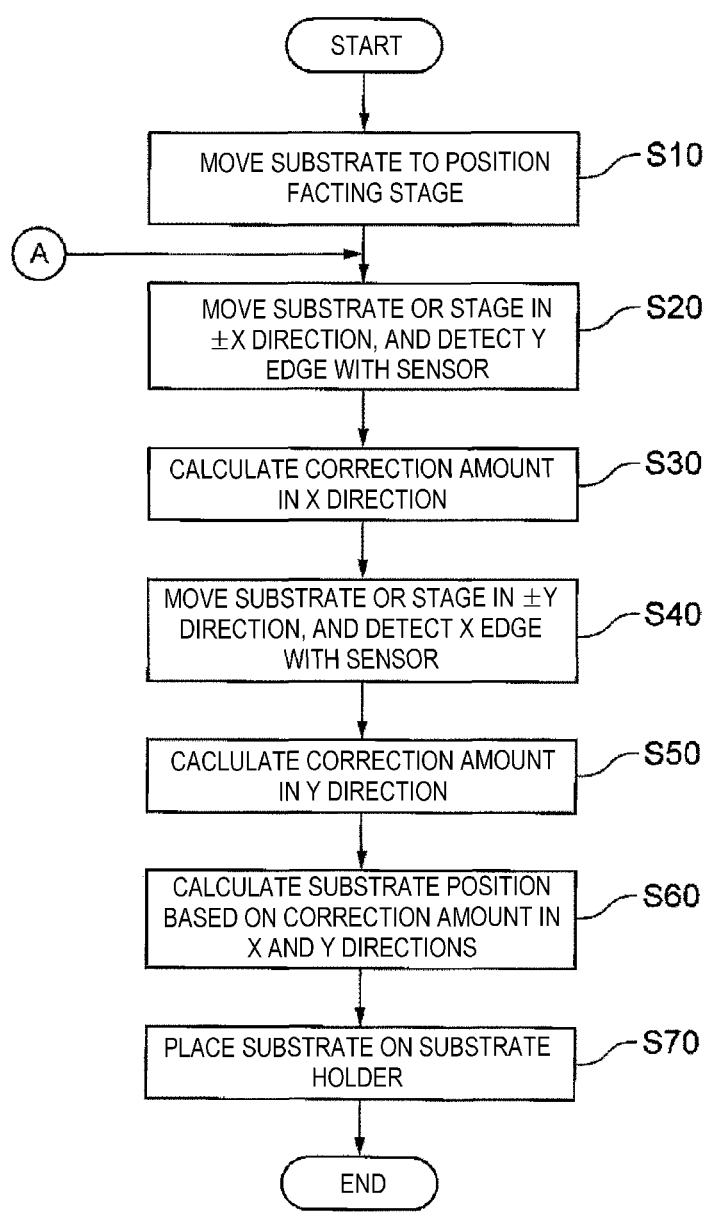
FIG. 10 is a flowchart of a correction processing of a center position of a substrate.

FIG. 10 is a flowchart of a correction processing of a center position of a substrate. One or more of the controller 175 of the substrate processing apparatus 100, the control unit 29a of the substrate attaching/detaching section 290, and the control unit 27a of the transport robot 27 cooperate with each other so as to execute this control.

In step S10, the transport robot 27 transports the substrate S to a position facing the stage 1210 (the predetermined position). The position of the substrate S at this time is assumed to be the initial position P1 (FIG. 6A).

In step S20, the transport robot 27 moves the substrate S in the −X direction with respect to the stage 1210 until the sensor 60a detects the Y edge (side L1) of the substrate S (FIG. 7). The position of the substrate S at this time is assumed to be P2. The movement amount until the sensor 60a detects the side L1 of the substrate S (the movement amount from the position P1 to the position P2), A1, is calculated in the transport robot 27 and stored in the memory. Further, the transport robot 27 moves the substrate S in the +X direction with respect to the stage 1210 until the sensor 60b detects the Y edge (side L3) of the substrate S (FIG. 8). The position of the substrate at this time is assumed to be P3. The movement amount until the sensor 60b detects the side L3 of the substrate S (the movement amount from the position P1 to the position P3), A2, is calculated in the transport robot 27 and stored in the memory. Instead of moving the substrate S by the transport robot 27, the relative position of the substrate S with respect to the stage 1210 (sensor 60) may be changed by moving the stage 1210.

In step S30, the correction amount in the X direction, ΔX, is calculated based on Equation (3).

In step S40, the substrate is moved in the +Y direction with respect to the stage by the transport robot 27 until the sensor 60c detects the X edge (side L2) of the substrate (FIG. 9). The position of the substrate S at this time is assumed to be P4. The movement amount until the sensor 60c detects the side L2 of the substrate S (the movement amount from the position P1 to the position P4), B1, is calculated in the transport robot 27 and stored in the memory. In addition, the substrate is moved in the −Y direction with respect to the stage by the transport robot 27 until the sensor 60d detects the X edge (side L4) of the substrate (FIG. 9). The position of the substrate at this time is assumed to be P5. The movement amount until the sensor 60d detects the X edge of the substrate (the movement amount from the position P1 to the position P5), B2, is calculated in the transport robot 27 and stored in the memory.

In step S50, the correction amount ΔY in the Y direction is calculated based on Equation (6).

In step S60, the position of the substrate S is corrected based on the correction amounts ΔX and ΔY in the X direction and the Y direction. That is, the position of the substrate S is moved such that the center position C1 of the substrate S coincides with the target center position C0. At this time, the substrate S may be moved with respect to the stage by the transport robot 27, or the position of the substrate relative to the stage may be changed by moving the stage.

In step S70, the substrate S after the positioning (alignment) is placed on the second holding member 400 of the substrate holder 11 by the transport robot 27.

According to the present embodiment, the center position C1 of the substrate S is corrected in the X direction based on the detection values of the sensors 60a and 60b, and the center position C1 of the substrate S may be corrected in the Y direction based on the detection values of the sensors 60c and 60d. Therefore, it is possible to correctly align the substrate even with respect to a substrate S having different dimensions due to, for example, manufacturing tolerance. In addition, it is not necessary to measure or acquire the actual dimensions of the transported substrate S. In addition, by measuring the movement amounts A1, A2, B1, and B2, the actual dimensions 2X1 and 2Y1 of the substrate S can be calculated from Equation (1) or (2), and Equation (3) or (4). The calculated actual dimensions of the substrate S may be stored so as to create a database.

Since it is sufficient if each sensor is capable of detecting an edge (side) of the substrate, it is not necessary to use an image recognition processing or an image sensor such as, for example, a camera. Therefore, it is possible to implement correction of the center position of a substrate at a low cost by a simple calculation processing.

Second Embodiment

Figure 11:
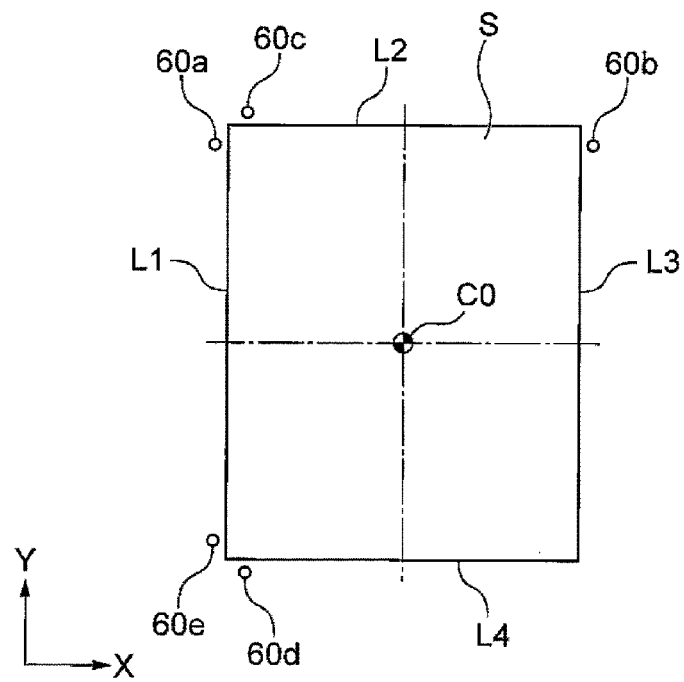
FIG. 11 is a plan view of a substrate position detection device according to a second embodiment.

FIG. 11 is a plan view of a substrate position detection device according to a second embodiment. The present embodiment is different from the first embodiment in that an inclination of a substrate (rotation angle θ) is calculated by disposing a sensor 60e in addition to the sensor 60a on one edge (side L1) of the substrate S and detecting one edge with the two sensors. Because the other configurations are the same as the first embodiment, so duplicate descriptions will be omitted. Here, the case where the rotation angle is calculated based on the detection of the side L1 will be described, but the rotation angle may be calculated based on the detection of an arbitrary side. However, providing the long sides L1 and L3 is advantageous from the viewpoint of improving the detection precision of the inclination. Alternatively, the inclination of the substrate may be obtained by providing two sensors on a plurality of sides and averaging the values of the inclinations detected on respective sides.

FIGS. 12 to 16 are explanatory views for explaining a correction processing of a rotation angle of a substrate. In the processing of detecting the rotation angle of the substrate, since only the sensors 60a and 60e are used, the sensors 60b to 60d are omitted in these drawings.

The sensors 60a and 60e are arranged to have different Y coordinates at the same X coordinate. That is, the sensors 60a and 60e are arranged parallel to the side L1 of the substrate S. The distance between the sensors 60a and 60e is assumed to be P. Increasing the distance P between the sensors 60a and 60e as much as possible is advantageous in that the detection precision of the inclination of the substrate S is improved. Therefore, in the present embodiment, the sensors 60a and 60e are respectively disposed near the end portions (corner portions) on the opposite sides of the side L1. However, when the detection accuracy is within an allowable range, the distance between the sensors 60a and 60e may be shortened.

Figure 12:
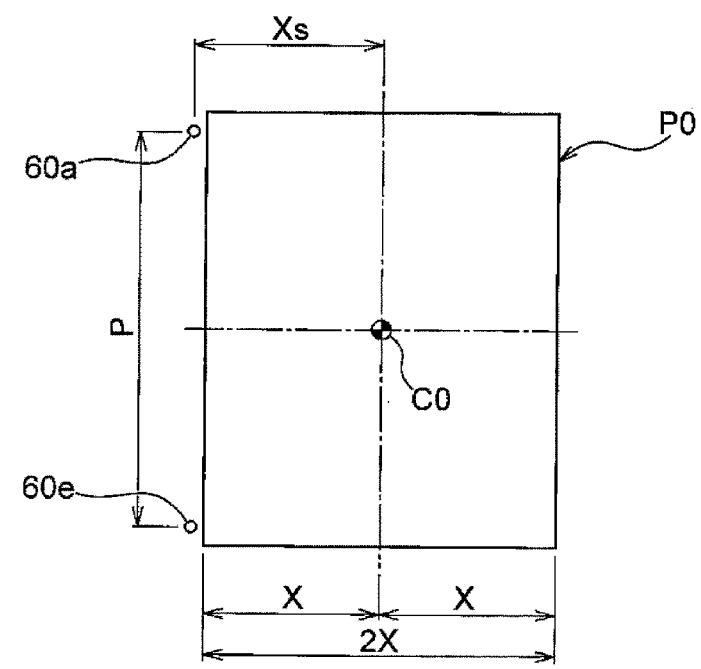
FIG. 12 is an explanatory view for explaining a correction processing of a rotation angle of a substrate.
Figure 13:
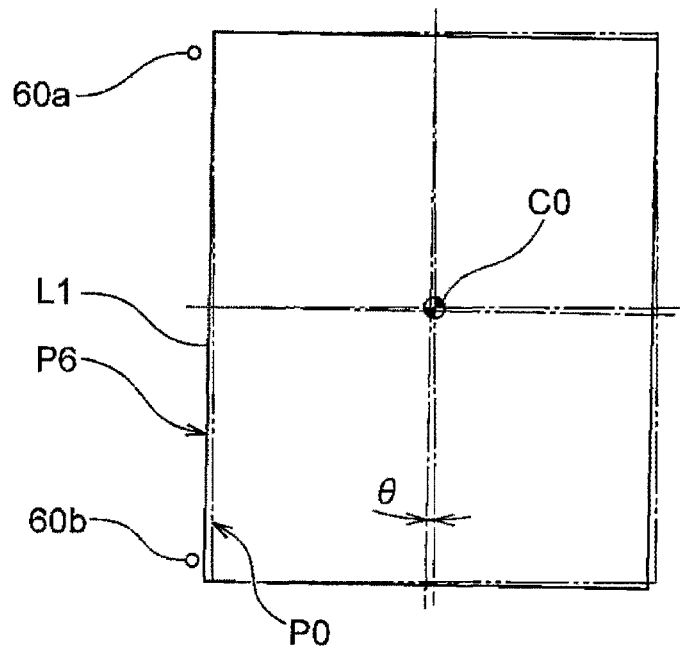
FIG. 13 is an explanatory view for explaining a correction processing of a rotation angle of a substrate.

FIG. 12 illustrates a substrate when the substrate is at a regular position P0 (rotation angle θ=θ0=0, center position=target center position C0). In FIG. 13, the substrate is inclined with the rotation angle θ (other than 0). In addition, the center position of the substrate is also displaced from the target center position C0. The position of the substrate at this time is assumed to be P6. As described above, the dimension of the substrate S may have an error from a design value.

Figure 14:
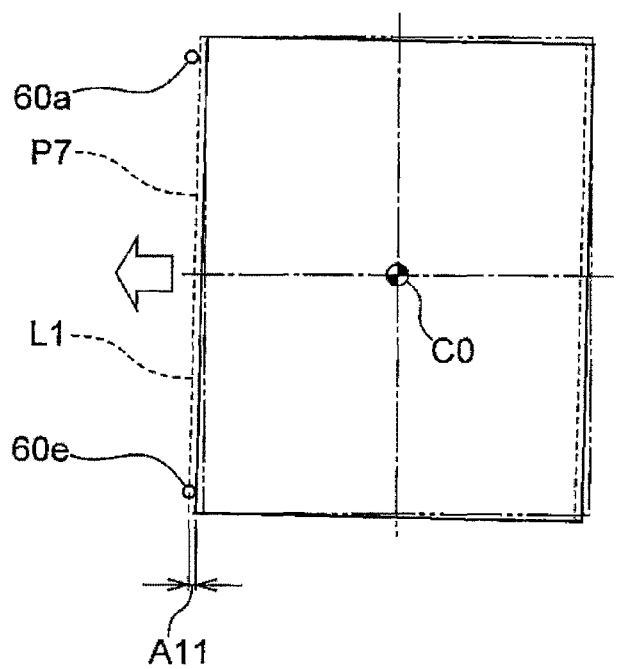
FIG. 14 is an explanatory view for explaining a correction processing of a rotation angle of a substrate.
Figure 15:
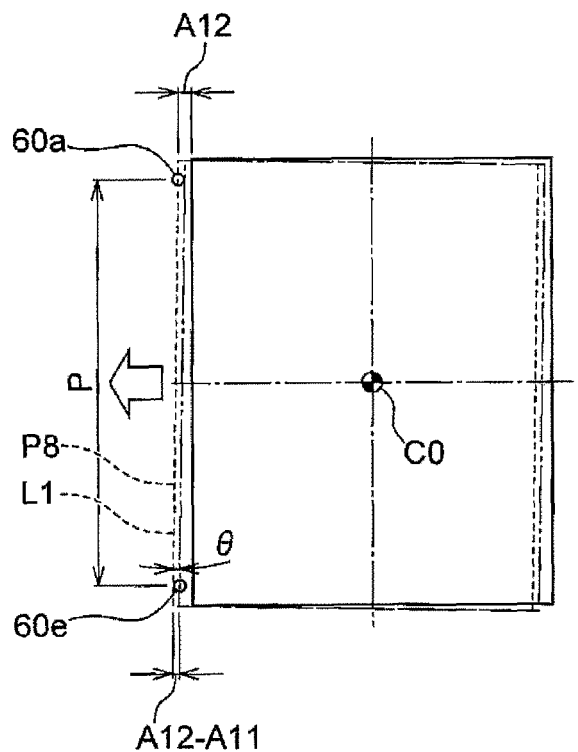
FIG. 15 is an explanatory view for explaining a correction processing of a rotation angle of a substrate.
Figure 16:
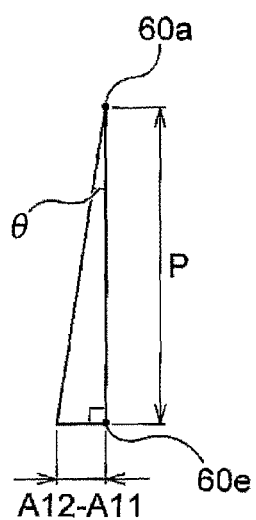
FIG. 16 is an explanatory view for explaining a correction processing of a rotation angle of a substrate.

When the transported substrate is at the position P6, the substrate S is moved in the −X direction until the sensor 60e detects the side L1 as the Y edge of the substrate as illustrated in FIG. 14. The position of the substrate S at this time is assumed to be P7. The movement amount when the substrate S is moved from the initial position P6 to the position P7 is assumed to be A11. Further, as illustrated in FIG. 15, the substrate S is moved in the −X direction until the sensor 60a detects the side L1 of the substrate S. The position of the substrate at this time is assumed to be P8. The movement amount when the substrate S is moved from the initial position P6 to the position P8 is assumed to be A12. As illustrated in FIGS. 15 and 16, a right triangle is formed by the length corresponding to the difference between the movement amount A11 for moving the substrate S from the initial position P1 to the position P7 and the movement amount A12 for moving the substrate from the initial position P1 to the position P8, the distance P between the sensors 60a and 60e, and a portion of the side L1, and the angle between the side L1 and the side of the length P corresponds to the rotation angle θ of the substrate. The rotation angle θ of the substrate satisfies Equation (7) as follows, and can be calculated as in Equation (8).

$$\tan \theta = (A12 - A11)/P \quad (7)$$

$$\theta = \arctan(A12 - A11)/P \quad (8)$$

As a result, when the substrate is rotated counterclockwise by the rotation angle θ calculated by Equation (8), the inclination of the substrate is capable of being corrected and the rotation angle θ is capable of matching with the target rotation angle (θ0=0). In addition, when the rotation angle θ of the substrate S is such that the side L1 of the substrate S is detected first by the sensor 60a, the substrate S is rotated clockwise by the rotation angle θ. Which sensor 60a or 60e first detects the side L1 depends on the rotation direction of the substrate S.

As described above, when the rotation angle θ of the substrate S is corrected to 0, the center position of the substrate S does not always coincide with the target center position C0. Thus, as illustrated in FIGS. 5 to 10 of the first embodiment, the correction amounts ΔX and ΔY of the center positions of the substrate S in the X direction and the Y direction are calculated so as to perform the processing of correcting the center position of the substrate S to the target center position C0. In addition, any of the plurality of sensors 60a and 60e may be used in the processing of detecting the side L1 (FIG. 7 and step S20 in FIG. 10).

Figure 17:
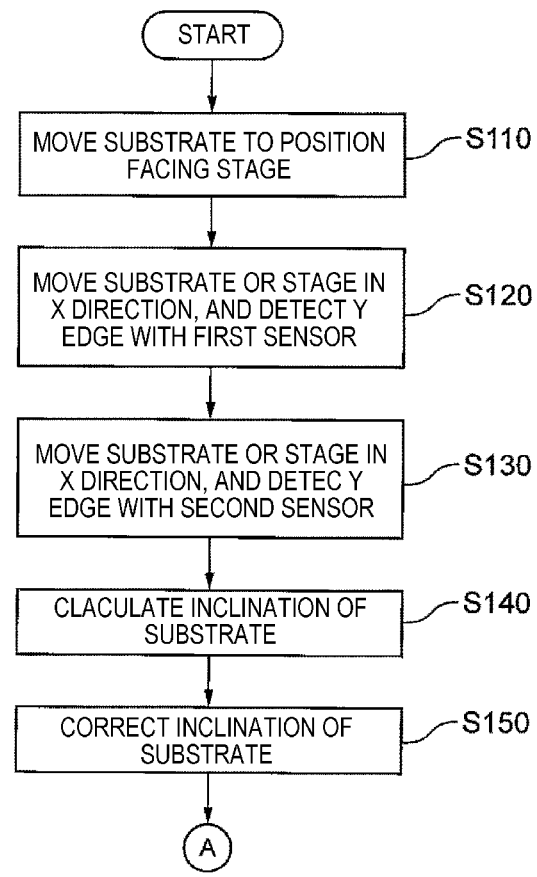
FIG. 17 is a flowchart of a correction processing of a rotation angle of a substrate.

FIG. 17 is a flowchart of a correction processing of the rotation angle of the substrate 10. One or more of the controller 175 of the substrate processing apparatus, the control unit 29a of the substrate attaching/detaching section 290, and the control unit 27a of the transport robot 27 cooperate with each other so as to execute this control.

In step S110, the transport robot 27 transports the substrate S to a position facing the stage 1210 (the predetermined position). The position of the substrate at this time is assumed to be the initial position P6 (FIG. 13).

In step S120, the transport robot 27 moves the substrate S in the −X direction with respect to the stage 1210 until one of the sensors 60a and 60e detects the side L1 as the Y edge of the substrate S. The position of the substrate at this time is assumed to be P7 (FIG. 14). In addition, the movement amount until one of the sensors 60a and 60e detects the Y edge of the substrate (the movement amount from the position P6 to the position P7), A11, is calculated. Instead of moving the substrate S by the transport robot 27, the relative position of the substrate S with respect to the stage (sensor) may be changed by moving the stage (sensor).

In step S130, the substrate S is moved by the transport robot 27 in the −X direction with respect to the stage 1210 until the other one of the sensors 60a and 60e also detects the side L1 of the substrate S. The position of the substrate S at this time is assumed to be P8 (FIG. 15). In addition, the movement amount until the other one of the sensors 60a and 60e detects the Y edge of the substrate S (the movement amount from the position P6 to the position P8), A12, is calculated.

In step S140, the rotation angle θ of the substrate is calculated based on Equation (8) using the movement amounts A11 and A12.

In step S150, the position of the substrate S (the rotation angle θ of the substrate S) is corrected based on the calculated rotation angle θ of the substrate in consideration of which sensor 60a or 60e has first detected the side L1. That is, the position of the substrate S is moved (the substrate S is rotated) such that the rotation angle θ of the substrate S coincides with the target rotation angle (θ=0). At this time, the substrate may be moved with respect to the stage by the transport robot, or the position of the substrate relative to the stage may be changed by moving the stage.

After the rotation angle of the substrate is corrected in step S150, the process proceeds to step S20 of FIG. 10. In steps S20 to S60, after the center position of the substrate S is corrected to the target center position C0, the substrate is disposed on the second holding member 400 on the stage (step S70). In addition, any of the plurality of sensors 60a and 60e may be used in the processing of detecting the side L1 (step S20 in FIG. 10).

In the present embodiment, since the rotation angle of the substrate is corrected in addition to the correction of the center position of the substrate, the position of the substrate is capable of being aligned more precisely to an installation object such as the substrate holder or the stage. In addition, it is possible to correct the center position of the substrate more quickly and more accurately because the center position of the substrate is corrected after correcting the rotational position of the substrate. As a result, the positioning of the substrate is capable of being performed more quickly and more accurately.

(Modification 1) In the above-described embodiments, the substrate S and the second holding member 400 are positioned (aligned) in the horizontal state. However, even when the substrate S and the second holding member 400 are in the vertical state, it is possible to perform positioning in the same manner.

(Modification 2) In the above-described embodiments, a description has been made of the case where the substrate is positioned (aligned) on the substrate holder (second holding member) in the substrate attaching/detaching section. However, the above-described embodiments are applicable when a substrate is positioned with respect to any member or device. For example, the above-described embodiments may be used in the case where a substrate is positioned and disposed on a temporary table or a processing table of any substrate processing apparatus such as, for example, a plating apparatus, a polishing apparatus, a grinding apparatus, a film forming apparatus, and an etching apparatus. In addition, the present disclosure may also be used even when a substrate is positioned and mounted on a plate in a grinding apparatus that performs grinding and/or polishing on a substrate in a work unit state where the substrate is fixed to the plate.

(Modification 3) In the above-described embodiments, the case where the substrate has a square shape is taken as an example, but the substrate may have a polygonal shape other than the square shape, for example, a pentagonal shape or a hexagonal shape.

At least the following technical ideas are grasped from the above-described embodiments.

According to a first aspect, provided is a substrate processing apparatus for processing a substrate having two sides extending in a first direction and two sides extending in a second direction. The substrate processing apparatus includes: a stage configured to place thereon the substrate or at least a portion of a substrate holding member configured to hold the substrate; a transport device configured to transport the substrate to a position facing the stage; first and second sensors, which are fixed relative to the stage and respectively located outside the sides, extending in the second direction, of the substrate at the position facing the stage so as to detect the sides of the substrate, respectively; and third and fourth sensors, which are fixed relative to the stage and respectively located outside the sides, extending in the first direction, of the substrate at the position facing the stage so as to detect the sides of the substrate, respectively.

According to this aspect, it is possible to correct the center position of the substrate in the first direction based on the detection values of the first and second sensors, and correct the center position of the substrate in the second direction based on the detection values of the third and fourth sensors. Therefore, it is possible to more accurately perform the positioning for substrates having different dimensions due to, for example, a manufacturing tolerance.

Since it is sufficient if each sensor is capable of detecting an edge (side) of the substrate, it is not necessary to use an image recognition processing or an image sensor such as, for example, a camera. Therefore, it is possible to implement correction of the center position of a substrate at a low cost or by a simple calculation processing.

In a second aspect, the substrate processing apparatus of the first aspect further includes: a control device configured to: change relative positions of the stage and the substrate in the first and second directions until the first to fourth sensors detect respective sides of the substrate adjacent thereto when the substrate is transported to the position facing the stage; calculate respective displacement amounts of the relative positions required until the first to fourth sensors detect the respective sides of the substrate; calculate errors of the position of the substrate from a target position in the first and second directions based on the respective displacement amounts; and adjust the substrate to the target position based on the errors in the first and second directions.

According to this aspect, it is possible to calculate respective errors in the first direction and the second direction of the center position of the substrate by detecting the movement amounts of the substrate until the respective sensors detect the sides adjacent thereto. Accordingly, it is possible to more accurately correct the center position of the substrate to the target position without calculating the center position itself.

According to a third aspect, in the substrate processing apparatus of the second aspect, the substrate is moved relative to the stage by the transport device until the first to fourth sensors detect the respective sides of the substrate, respectively.

According to this aspect, it is possible to move the substrate relative to each sensor using the function of the transport device. Even when the stage does not have a moving function, it is possible to move the substrate.

According to a fourth aspect, in the substrate processing apparatus of the second aspect, the stage is moved relative to the substrate until the first to fourth sensors detect the respective sides of the substrate, respectively.

According to this aspect, it is possible to move the substrate relative to each sensor using the moving function of the stage.

According to a fifth aspect, in the substrate processing apparatus of any one of the second to fourth aspects, the substrate is adjusted to the target position by moving the substrate relative to the stage by the transport device based on the errors in the first and second directions.

According to this aspect, it is possible to move the substrate to approach the target position using the function of the transport device. Even when the stage does not have a moving function, it is possible to move the substrate.

According to a sixth aspect, in the substrate processing apparatus of any one of the second to fourth aspects, the substrate is adjusted to the target position by moving the stage based on the errors in the first and second directions.

According to this aspect, it is possible to move the substrate to approach the target position using the moving function of the stage.

According to a seventh aspect, in the substrate processing apparatus of the fifth or sixth aspect, the substrate adjusted to the target position is placed on the substrate holding member or the stage by the transport device.

According to this aspect, it is possible to place the substrate on the substrate holding member or the stage after aligning the substrate with the substrate holding member or the stage.

According to an eighth aspect, provided is a substrate processing apparatus for processing a substrate having two sides extending in a first direction and two sides extending in a second direction. The substrate processing apparatus includes: a stage configured to place thereon the substrate or at least a portion of a substrate holding member configured to hold the substrate; a transport device configured to transport the substrate to a position facing the stage; first and second sensors, which are fixed relative to the stage and located outside one side, extending in the second direction, of the substrate at the position facing the stage so as to detect the one side of the substrate; a third sensor, which is fixed relative to the stage and located outside a remaining side, extending in the second direction, of the substrate at the position facing the stage so as to detect the remaining side of the substrate; and fourth and fifth sensors, which are fixed relative to the stage and respectively located outside the sides, extending in the first direction, of the substrate at the position facing the stage so as to detect the sides of the substrate, respectively.

According to this aspect, it is possible to detect and correct the rotation angle of the substrate based on the detection values of the first and second sensors. In addition, it is possible to correct the center position of the substrate in the first direction based on the detection values of the first or second sensor and the third sensor, and correct the center position of the substrate in the second direction based on the detection values of the fourth and fifth sensors. Therefore, it is possible to more accurately perform the positioning for substrates having different dimensions due to, for example, a manufacturing tolerance. In addition, since it is possible to correct both the rotation angle and the center position of the substrate, it is possible to perform the alignment of the substrate more accurately.

Since it is sufficient if each sensor is capable of detecting an edge (side) of the substrate, it is not necessary to use an image sensor such as, for example, a camera. Therefore, it is possible to implement correction of the center position of the substrate at a low cost.

According to a ninth aspect, the substrate processing apparatus of the eighth aspect further includes a control device configured to: change relative positions of the stage and the substrate in the first direction until each of the first and second sensors detect one side of the substrate adjacent thereto when the substrate is transported to a predetermined position facing the stage; calculate respective displacement amounts of the relative positions required until the first and second sensors detect the side of the substrate; calculate a rotation angle of the substrate from a target position based on the respective displacement amounts; and adjust the substrate to the target position based on the rotation angle.

According to this aspect, since it is possible to detect the rotation angle of the substrate and correct the rotation angle of the substrate the target position (target rotation angle θ=0) by detecting a common side by the two sensors, the rotation angle of the substrate is capable of being detected easily with a low-cost configuration.

According to a tenth aspect, in the substrate processing apparatus of the ninth aspect, the control device is further configured to: change the relative positions of the stage and the substrate in the first and second directions until one of the first and second sensors and the third to fifth sensors detect respective sides of the substrate adjacent thereto when the substrate is transported to the predetermined position facing the stage; calculate respective displacement amounts of the relative positions required until the one of the first and second sensors and the third to fifth sensors detect the respective sides of the substrate; calculate errors of the position of the substrate from the target position in the first and second directions based on the respective displacement amounts; and adjust the substrate to the target position based on the errors in the first and second directions.

According to this aspect, it is possible to calculate respective errors in the first direction and the second direction of the center position of the substrate by further detecting the movement amounts of the substrate until the respective sensors detect the sides adjacent thereto. Accordingly, it is possible to more accurately correct the center position of the substrate to the target position without calculating the center position itself. As a result, it is possible to implement detection and correction of the rotation angle and the center position of the substrate easily and at a low cost.

According to an eleventh aspect, in the substrate processing apparatus of the ninth or tenth aspect, the substrate is moved relative to the stage by the transport device until each sensor detects each side of the substrate.

According to this aspect, it is possible to move the substrate relative to each sensor using the function of the transport device. Even when the stage does not have a moving function, it is possible to move the substrate.

According to a twelfth aspect, in the substrate processing apparatus of the ninth or tenth aspect, the stage is moved relative to the substrate until each sensor detects each side of the substrate.

According to this aspect, it is possible to move the substrate relative to each sensor using the moving function of the stage.

According to a thirteenth aspect, in the substrate processing apparatus of any one of the ninth to twelfth aspects, the substrate is adjusted to the target position by moving the substrate relative to the stage by the transport device based on the inclination and/or the errors in the first and second directions.

According to this aspect, it is possible to move the substrate to approach the target position using the function of the transport device. Even when the stage does not have a moving function, it is possible to move the substrate.

According to a fourteenth aspect, in the substrate processing apparatus of any one of the ninth to eleventh aspects, the substrate is adjusted to the target position by moving the stage based on the inclination and/or the errors in the first and second directions.

According to this aspect, it is possible to move the substrate to approach the target position using the moving function of the stage.

According to a fifteenth aspect, in the substrate processing apparatus of the thirteenth or fourteenth aspect, the substrate adjusted to the target position is set on the substrate holding member or the stage by the transport device.

According to a sixteenth aspect, provided is a method of controlling a substrate processing apparatus for processing a substrate having two sides extending in a first direction and two sides extending in a second direction. The method includes: transporting the substrate to a position facing the stage; changing relative positions of the substrate and the stage in the first direction until first and second sensors, which are fixed relative to the stage and respectively located outside the sides, extending in the second direction, of the substrate at the position facing the stage, detect the sides of the substrate, respectively; changing the relative positions of the substrate and the stage in the second direction until third and fourth sensors, which are fixed relative to the stage and respectively located outside the sides, extending in the first direction, of the substrate at the position facing the stage, detect the sides of the substrate, respectively; and calculating respective displacement amounts of the relative positions required until the first to fourth sensors detect respective sides of the substrate, and adjusting the position of the substrate to a target position based on the respective displacement amounts.

According to this aspect, the same action and effect as that of the first aspect can be obtained.

According to a seventh aspect, provided is a method of controlling a substrate processing apparatus for processing a substrate having two sides extending in a first direction and two sides extending in a second direction. The method includes: transporting the substrate to a position facing the stage; changing relative positions of the substrate and the stage in the first direction until first and second sensors, which are fixed relative to the stage and located outside one side, extending in the second direction, of the substrate at the position facing the stage, detect the one side of the substrate; calculating respective displacement amounts of the relative positions required until the first and second sensors detect the one side of the substrate, calculating the rotation angle of the substrate based on the respective displacement amounts, and adjusting the rotation angle of the substrate based on the calculated rotation angle; changing the relative positions of the substrate and the stage in the first direction until the first or second sensor detects the one side of the substrate; changing the relative positions of the substrate and the stage in the first direction until a third sensor, which is fixed relative to the stage and located outside a remaining side, extending in the second direction, of the substrate at the position facing the stage, detects the remaining side of the substrate; changing the relative positions of the substrate and the stage in the second direction until fourth and fifth sensors, which are fixed relative to the stage and respectively located outside the sides, extending in the first direction, of the substrate at the position facing the stage, detect the sides of the substrate, respectively; and calculating respective displacement amounts of the relative positions required until any one of the first and second sensors and the third to fifth sensors detect the respective sides of the substrate, calculating errors of the substrate from a target position in the first and second directions based on the respective displacement amounts, and adjusting the substrate to the target position based on the errors in the first and second directions.

According to this aspect, the same action and effect as that of the eighth aspect can be obtained.

According to an eighteenth aspect, provided is a non-transitory computer-readable medium that stores a program that, when executed, causes a computer to execute a method of controlling a substrate processing apparatus for processing a substrate having two sides extending in a first direction and two sides extending in a second direction. The method includes: transporting the substrate to a position facing the stage; changing relative positions of the substrate and the stage in the first direction until first and second sensors, which are fixed relative to the stage and respectively located outside the sides, extending in the second direction, of the substrate at the position facing the stage, detect the sides of the substrate, respectively; changing the relative positions of the substrate and the stage in the second direction until third and fourth sensors, which are fixed relative to the stage and respectively located outside the sides, extending in the first direction, of the substrate at the position facing the stage, detect the sides of the substrate, respectively; and calculating respective displacement amounts of the relative positions required until the first to fourth sensors detect respective sides of the substrate, and adjusting the position of the substrate to a target position based on the respective displacement amounts.

According to this aspect, the same action and effect as that of the first aspect can be obtained.

According to a ninth aspect, provided is a non-transitory computer-readable medium that stores a program that, when executed, causes a computer to execute a method of controlling a substrate processing apparatus for processing a substrate having two sides extending in a first direction and two sides extending in a second direction. The method includes: transporting the substrate to a position facing the stage; changing relative positions of the substrate and the stage in the first direction until first and second sensors, which are fixed relative to the stage and located outside one side, extending in the second direction, of the substrate at the position facing the stage, detect the one side of the substrate; calculating respective displacement amounts of the relative positions required until the first and second sensors detect the one side of the substrate, calculating the rotation angle of the substrate based on the respective displacement amounts, and adjusting the rotation angle of the substrate based on the calculated rotation angle; changing the relative positions of the substrate and the stage in the first direction until the first or second sensor detects the one side of the substrate; changing the relative positions of the substrate and the stage in the first direction until a third sensor, which is fixed relative to the stage and located outside a remaining side, extending in the second direction, of the substrate at the position facing the stage, detects the remaining side of the substrate; changing the relative positions of the substrate and the stage in the second direction until fourth and fifth sensors, which are fixed relative to the stage and respectively located outside the sides, extending in the first direction, of the substrate at the position facing the stage, detect the sides of the substrate, respectively; and calculating respective displacement amounts of the relative positions required until any one of the first and second sensors and the third to fifth sensors detect the respective sides of the substrate, calculating errors of the substrate from a target position in the first and second directions based on the respective displacement amounts, and adjusting the substrate to the target position based on the errors in the first and second directions.

According to this aspect, the same action and effect as that of the eighth aspect can be obtained.

Although the embodiments of the present disclosure have been described based on some examples, the embodiments of the present disclosure described above are for facilitating understanding of the present disclosure and do not limit the present invention. The present disclosure can be changed and improved without departing from the spirit of the present disclosure, and of course, the present disclosure includes equivalents thereof. For example, in the plating apparatus according to any one of the above-described embodiments, after a substrate is on the second holding member 400, the first holding member may be brought close to the substrate without changing the posture of the substrate such that the is sandwiched between the first holding member and the second holding member. In addition, it is possible to arbitrarily combine or omit respective constituent elements described in the claims and the specification in a range in which at least some of the above-mentioned problems can be solved or in a range in which at least some of the effects are exhibited.

What is claimed is:

1. A substrate processing apparatus comprising:
a stage configured to place thereon a substrate or place at least a portion of a substrate holding member configured to hold the substrate, the substrate having two sides extending in a first direction and two sides extending in a second direction orthogonal to the first direction with adjacent sides of the substrate forming corners therebetween;
a transporter configured to transport the substrate to a position facing the stage;
first and second sensors which are fixed relative to the stage, each of the first and second sensors respectively located outside opposing sides of the substrate extending in the second direction and proximate to a respective corner of the substrate, the first and second sensors each being separated from a target center of the substrate in the first direction by a same first predetermined distance, at the position facing the stage so as to detect the sides of the substrate adjacent the first and second sensors, respectively;
third and fourth sensors which are fixed relative to the stage, each of the third and fourth sensors respectively located outside opposing sides of the substrate extending in the first direction and proximate to a respective corner of the substrate, the third and fourth sensors each being separated from the target center of the substrate in the second direction by a same second predetermined distance, at the position facing the stage so as to detect the sides of the substrate adjacent the third and fourth sensors, respectively; and a controller configured to: change relative positions of the stage and the substrate in the first and second directions until the first to fourth sensors detect respective sides of the substrate adjacent thereto when the substrate is transported to the position facing the stage; calculate respective displacement amounts of the relative positions required until the first to fourth sensors detect the respective sides of the substrate; calculate errors of the position of the substrate from a target position in the first direction based on the respective displacement amounts in the first direction detected by the first and second sensors and the first predetermined distance; calculate errors of the position of the substrate from the target position in the second direction based on the respective displacement amounts detected by the third and fourth sensors in the second direction and the second predetermined distance; and adjust the substrate to the target position based on the errors calculated in the first and second directions.

2. The substrate processing apparatus of claim 1, wherein the substrate is moved relative to the stage by the transporter until the first to fourth sensors detect the respective sides of the substrate, respectively.

3. The substrate processing apparatus of claim 1, wherein the stage is moved relative to the substrate until the first to fourth sensors detect the respective sides of the substrate, respectively.

4. The substrate processing apparatus of claim 1, wherein the substrate is adjusted to the target position by moving the substrate relative to the stage by the transporter based on the errors in the first and second directions.

5. The substrate processing apparatus of claim 1, wherein the substrate is adjusted to the target position by moving the stage based on the errors in the first and second directions.

6. The substrate processing apparatus of claim 4, wherein the substrate adjusted to the target position is set on the substrate holding member or the stage by the transporter.

7. A substrate processing apparatus comprising:
a stage configured to place thereon a substrate or at least a portion of a substrate holding member configured to hold the substrate, the substrate having two sides extending in a first direction and two sides extending in a second direction orthogonal to the first direction with adjacent sides of the substrate forming corners therebetween;

a transporter configured to transport the substrate to a position facing the stage;

first and second sensors which are fixed relative to the stage, each of the first and second sensor respectively located outside opposing sides of the substrate extending in the second direction at one end of the substrate and proximate to a respective corner of the substrate, the first and second sensors each being aligned along the first direction and separated from a target center of the substrate in the first direction by a same first predetermined distance, at the position facing the stage so as to detect the sides of the substrate adjacent the first and second sensors, respectively;

a third sensor which is fixed relative to the stage and located outside one of the sides of the substrate extending in the second direction at a remaining end of the substrate opposite the one end, and positioned proximate to a remaining corner of the substrate, at the position facing the stage so as to detect the respective side of the substrate at the remaining end side; and fourth and fifth sensors which are fixed relative to the stage, each of the fourth and fifth sensors respectively located outside opposing sides of the substrate extending in the first direction and proximate to a respective corner of the substrate, the fourth and fifth sensors each being separated from the target center of the substrate in the second direction by a same second predetermined distance, at the position facing the stage so as to detect the sides of the substrate adjacent the fourth and fifth sensors, respectively; and a controller configured to: change relative positions of the stage and the substrate in the first direction until each of the first and third sensors detect one side of the substrate adjacent thereto when the substrate is transported to a predetermined position facing the stage; calculate respective displacement amounts of the relative positions required until the first and third sensors both detect the side of the substrate; calculate a rotation angle of the substrate from a target position based on the respective displacement amounts detected by the first and third sensors; and adjust the substrate to the target position based on the rotation angle.

8. The substrate processing apparatus of claim 7, wherein the controller is further configured to: change the relative positions of the stage and the substrate in the first and second directions until the first, second, fourth, and fifth sensors detect respective sides of the substrate adjacent thereto when the substrate is transported to the predetermined position facing the stage; calculate respective displacement amounts of the relative positions required until the first, second, fourth, and fifth sensors detect the respective sides of the substrate; calculate errors of the position of the substrate from the target position in the first direction based on the respective displacement amount in the first direction detected by the first and second sensors and the first predetermined distance; calculate errors of the position of the substrate from the target position in the second direction based on the respective displacement amounts detected by the fourth and fifth sensors in the second direction and the second predetermined distance; and adjust the substrate to the target position based on the errors calculated in the first and second directions.

9. The substrate processing apparatus of claim 7, wherein the substrate is moved relative to the stage by the transporter until each sensor detects each side of the substrate.

10. The substrate processing apparatus of claim 7, wherein the stage is moved relative to the substrate until each of the first to fifth sensors detects each respective side of the substrate.

11. The substrate processing apparatus of claim 7, wherein the substrate is adjusted to the target position by moving the substrate relative to the stage by the transporter based on the rotation angle and/or the errors in the first and second directions.

12. The substrate processing apparatus of claim 7, wherein the substrate is adjusted to the target position by moving the stage based on the rotation angle and/or the errors in the first and second directions.

13. The substrate processing apparatus of claim 11, wherein the substrate adjusted to the target position is placed on the substrate holding member or the stage by the transporter.

14. A method of controlling a substrate processing apparatus, the method comprising:

transporting a substrate to a position facing the stage, the substrate having two sides extending in a first direction and two sides extending in a second direction orthogonal to the first direction with adjacent sides of the substrate forming corners therebetween;

changing relative positions of the substrate and the stage along the first direction until first and second sensors, which are fixed relative to the stage and respectively located outside opposing sides of the substrate extending in the second direction, positioned proximate a respective corner of the substrate, and separated from a target center of the substrate in the first direction by a same first predetermined distance, at the position facing the stage, detect the sides of the substrate, respectively;

changing the relative positions of the substrate and the stage along the second direction until third and fourth sensors, which are fixed relative to the stage and respectively located outside opposing sides of the substrate extending in the first direction, positioned proximate a respective corner of the substrate, and separated from the target center of the substrate in the second direction by a same second predetermined distance, at the position facing the stage, detect the sides of the substrate, respectively; and calculating respective displacement amounts of the relative positions required until the first to fourth sensors detect respective sides of the substrate, calculating errors of the position of the substrate from a target position in the first direction based on the respective displacement amounts in the first direction detected by the first and second sensors and the first predetermined distance; calculating errors of the position of the substrate from the target position in the second direction based on the respective displacement amounts detected by the third and fourth sensors in the second direction and the second predetermined distance; and adjusting the position of the substrate to a target position based on the errors calculated in the first and second directions.

15. A method of controlling a substrate processing apparatus, the method comprising:

transporting a substrate to a position facing the stage, the substrate having two sides extending in a first direction and two sides extending in a second direction orthogonal to the first direction with adjacent sides of the substrate forming corners therebetween;

changing relative positions of the substrate and the stage along the first direction until first and third sensors at the position facing the stage, detect one side of the substrate, the first sensor, a second sensor, and the third sensor being fixed relative to the stage, the first and second sensors each respectively located outside opposing sides of the substrate extending in the second direction at one end of the substrate and proximate to a respective corner of the substrate, the first and second sensors each being aligned along the first direction, and the third sensor being located outside the one side of the substrate extending in the second direction at a remaining end of the substrate opposite the one end;

calculating respective displacement amounts of the relative positions required until the first and third sensors both detect the one side of the substrate, calculating the rotation angle of the substrate based on the respective displacement amounts, and adjusting the rotation angle of the substrate based on the calculated rotation angle;

changing the relative positions of the substrate and the stage along the first direction until at least one of the first and second sensors detect the one side or an other side of the substrate opposite the one side, extending in the second direction;

changing the relative positions of the substrate and the stage along the second direction until fourth and fifth sensors, which are fixed relative to the stage and respectively located outside opposing sides of the substrate extending in the first direction, and positioned proximate to a respective corner of the substrate, at the position facing the stage, detect the sides of the substrate, respectively; and calculating respective displacement amounts of the relative positions required until any one of the first and second sensors and the third to fifth sensors detect the respective sides of the substrate, calculating errors of the substrate from a target position in the first and second directions based on the respective displacement amounts, and adjusting the substrate to the target position based on the errors in the first and second directions.

16. A non-transitory computer-readable medium that stores a program that, when executed, causes a computer to execute a process of controlling a substrate processing apparatus, the process comprising:

transporting a substrate to a position facing the stage, the substrate having two sides extending in a first direction and two sides extending in a second direction orthogonal to the first direction with adjacent sides of the substrate forming corners therebetween;

changing relative positions of the substrate and the stage along the first direction until first and second sensors, which are each fixed relative to the stage and respectively located outside opposing sides of the substrate extending in the second direction, positioned proximate a respective corner of the substrate, and separated from a target center of the substrate in the first direction by a same first predetermined distance, at the position facing the stage, detect the sides of the substrate, respectively;

changing the relative positions of the substrate and the stage along the second direction until third and fourth sensors, which are each fixed relative to the stage and respectively located outside opposing sides of the substrate extending in the first direction, positioned proximate a respective corner of the substrate, and separated from the target center of the substrate in the second direction by a same second predetermined distance, at the position facing the stage, detect the sides of the substrate, respectively; and calculating respective displacement amounts of the relative positions required until the first to fourth sensors detect respective sides of the substrate, calculating errors of the position of the substrate from a target position in the first direction based on the respective displacement amounts in the first direction detected by the first and second sensors and the first predetermined distance; calculating errors of the position of the substrate from the target position in the second direction based on the respective displacement amounts detected by the third and fourth sensors in the second direction and the second predetermined distance; and adjusting the position of the substrate to a target position based on the respective displacement amounts.

17. A non-transitory computer-readable medium that stores a program that, when executed, causes a computer to execute a process of controlling a substrate processing apparatus, the process comprising:

transporting a substrate to a position facing the stage, the substrate having two sides extending in a first direction and two sides extending in a second direction orthogonal to the first direction with adjacent sides of the substrate forming corners therebetween;

changing relative positions of the substrate and the stage along the first direction until first and third sensors extending in the second direction of the substrate at the position facing the stage, detect one side of the substrate, the first sensor, a second sensor, and the third sensor being fixed relative to the stage, the first and second sensors each respectively located outside opposing sides of the substrate extending in the second direction at one end of the substrate and proximate to a respective corner of the substrate, the first and second sensors each aligned along the first direction, and the third sensor being located outside the one side of the substrate extending in the second direction at a remaining end of the substrate opposite the one end;

calculating respective displacement amounts of the relative positions required until the first and third sensors both detect the one side of the substrate, calculating the rotation angle of the substrate based on the respective displacement amounts, and adjusting the rotation angle of the substrate based on the calculated rotation angle;

changing the relative positions of the substrate and the stage along the first direction until the first and second sensors detect the one side or an other side of the substrate opposite the one side, extending in the second direction;

changing the relative positions of the substrate and the stage along the second direction until fourth and fifth sensors, which are fixed relative to the stage and respectively located outside opposing sides of the substrate extending in the first direction, positioned proximate to a respective corner of the substrate, at the position facing the stage, detect the sides of the substrate, respectively; and calculating respective displacement amounts of the relative positions required until any one of the first, second, fourth, and fifth sensors detect the respective sides of the substrate, calculating errors of the substrate from a target position in the first and second directions based on the respective displacement amounts, and adjusting the substrate to the target position based on the errors in the first and second directions.

* * * * *